(12) United States Patent
Tindle et al.

(10) Patent No.: US 7,078,791 B1
(45) Date of Patent: Jul. 18, 2006

(54) CHIP ON BOARD PACKAGE FOR IMAGER

(75) Inventors: Gary D. Tindle, Chandler, AZ (US);
Ferry Gunawan, Santa Ana, CA (US)

(73) Assignee: ESS Technology, Inc., Fremont, CA (US)

( * ) Notice: Subject to any disclaimer, the term of this patent is extended or adjusted under 35 U.S.C. 154(b) by 650 days.

(21) Appl. No.: 09/852,397

(22) Filed: May 9, 2001

(51) Int. Cl.
*H01L 23/02* (2006.01)

(52) U.S. Cl. .................. 257/680; 257/98; 257/433

(58) Field of Classification Search ............ 257/680, 257/98–100, 81, 790, 433–434
See application file for complete search history.

(56) References Cited

U.S. PATENT DOCUMENTS 5,973,337 A * 10/1999 Knapp et al. .............. 257/99
6,627,872 B1 * 9/2003 FuKamura et al. ......... 250/239

* cited by examiner

*Primary Examiner*—Thanh Nguyen
(74) *Attorney, Agent, or Firm*—Stevens Law Group

(57) ABSTRACT

A semiconductor imager chip is mated directly to a laminate-type substrate, such as a printed circuit board. A well is formed by placing a retaining wall on the printed circuit board around the imager chip. An optical material such as a clear polymer is injected into the well to cover the imager chip. After the clear polymer cures (hardens) the retaining wall may be removed. The optical material may also have light filtering or other optical properties in addition to transmissivity. The printed circuit board may have one or more layers. Some of such layers may comprise a groundplane. High speed digital and analog lines may be strategically routed on the one or more layers to minimize interference with adjacent signal lines. Traditional sockets that receive ceramic or plastic chip carrier packages may be used in embodiments to receive the resultant printed circuit board based chip carrier. The circuit board may comprise a typical multi-component PCB or a chip-on-board carrier design.

14 Claims, 9 Drawing Sheets

CHIP ON BOARD PACKAGE FOR IMAGER

BACKGROUND OF THE INVENTION

1. Technical Field

The present invention is related to chip packages for integrated circuits. More precisely, the invention is related to a chip package to alleviate wiring effects and reducing cost in a hybrid analog/digital IC chip, or a combination low speed digital/high speed digital IC chip, such as a CMOS (Complementary Metal Oxide Semiconductor) Imager.

2. Related Art

Conventional chip packages are made with a number of techniques. First, one type of popular chip carrier is one known as a ceramic-leaded chip carrier (CLCC). Other types of chip packages include a plastic leadless chip carrier (PLCC), multi-layer ceramic pin grid ray (PGA) package, and ball grid ray (BGA) type packages. The PLCC and CLCC packages typically contain leads at the edge of the carrier. Most imagers, for example, utilize PLCC and CLCC packaging. The PGA and BGA packages typically contain leads on the bottom of the carrier in an array pattern.

In all these chip carrier packages, the basic principals remain the same. First, an IC chip is mated to the package substrate. The package substrate contains interconnections consisting of metallic traces that couple electric connections on the IC chip to leads on or in the chip package itself. As such, the IC chip is electrically connected to the external environment through the metallic traces and the leads present on the chip carrier package.

In the mating process for the chip carrier to the IC chip, the relative distances and areas used for the electrical interconnections are small. Thus, when a high-speed digital or analog line is close to another electrical line, high switching speeds or frequencies can create interference between the neighboring due to parasitic capacitance or inductance. The limited geometries of typical chip carrier packages inhibit the minimization of these problems.

Such problems are compounded with imager packaging. For example, as the resolution of CMOS (Complementary Metal Oxide Semiconductor) imager sensor cores increase, attempting to successfully design and package such imagers becomes increasingly difficult due to the corresponding increase in sensitivity to parasitic capacitance and inductance inherent in the package.

A cap or cover is employed to protect IC chips from the external environment. Typically a cap or cover, which may be made of a ceramic type material, for example, is bonded into place on the package made of the IC chip connected to the ceramic substrate. The ceramic materials are typically used to seal caps and covers to the module substrate. The ceramic type materials are also used to seal pin feed-through in the chip carrier modules.

Ceramic module sealing is typically used when the substrate and the cover are ceramic. The sealing materials are based on glasses with low melting temperatures since the sealing temperatures must not degrade the devices within the module. Typical sealing temperatures are in the range of 400° to 500° C. The glass is normally ground into a powder, then mixed into a paste with organic binders and saltants. The paste is applied to the seal areas by screening, stenciling, or extrusion, and the made in substrate cover (with mounted IC enclosed) are heated to flow the glass in former hermetic seal.

Glass is also used to fasten and seal through holes in the carrier modules. Short tubes of the glass sealing material are placed over the pins. Then the case, with the pins and preforms, is placed in a fixture for joining. The joining is accomplished by melting the glass, which then bonds to the pins and the case. Since this operation is performed before any of the devices are mounted to the module, the sealing temperatures are only limited by the properties of the case and the pins, and can be much higher than for module sealing.

Good properties of a sealing material include: the ability to form a hermetic seal; electrically insulating to prevent shorting; ability to wet the mating materials at the sealing temperature; and the ability to inhibit movement or stresses placed on the bonding of the IC chip to the substrate when in use due to thermal expansion.

In normal applications, the resulting chip and carrier is mated to a board that can itself be mated to another device. The board is typically a printed circuit board or the like. The card or planar surface has pads or holes to accept the terminals from the module. For LCC components, the connection points are pads. In the case of PGA components and dual inline packages (DIP), the pins interface into plated through holes in printed circuit boards. In both cases, the pins are soldered into place.

Typically, printed circuit boards consist of interleaved layers of conducting and insulating material. The insulating material may be such material as an epoxy/glass or a fiberglass surface, for example. The insulating surface is typically washed in a bath of conductive material to deposit a conductive layer on top of the insulating layer. Then, a circuitization step is accomplished using photoresist protecting the interconnection lines. The resulting traces form the electrical interconnects on the printed circuit board.

Many such layers can be combined through the use of plated through holes, or vias. In this manner, three-dimensional routing may be formed and routed. As such, the connection of a functional IC chip to an electronic device usually involves at least two different connection processes. First, the IC chip is typically mounted and electrically connected within a package, e.g., within a ceramic chip package. Next, the imager IC package is electrically coupled to a printed circuit for final insertion into the electronic device.

This multi-stage process is expensive, cumbersome and subject to failure. Specifically, the plurality of steps of electrical interconnection allow for a greater probability of failure because of a failure in the electrical interconnections between the IC chip and the imager IC package, or between the electrical package containing the IC chip and each board layer.

Additionally, the process of constructing a package contains many steps and uses relatively expensive materials. In a mass-market consumer market, a single type of packaged IC's may be distributed and used by the millions. For example, an imager IC chip may be employed across a wide spectrum of mass market items, such as digital cameras, security devices, communications devices, digital camcorders, and devices used in streaming web technology, just to name a few. The ease and cost of manufacturing these imagers is important in IC chips employed in such wide usage. Many other problems and disadvantages of the prior art will become apparent to one skilled in the art after comparing such prior art with the present invention as described herein.

SUMMARY

The imager chip has an electrical contact that transmits an electrical signal to or from the integrated circuit.

The package is made with a base insulating substrate, made out of a glass epoxy or laminate, such as a printed circuit board. The base insulating substrate is preformed with bond pads and electric leads. The bond pads are electrically coupled to the leads.

A imager chip is mated to the base insulating substrate, with the electrical contacts of the imager chip coupled to the bond pads when properly in place. Or, the bond pads may be coupled to the electrical contacts in a succeeding step. This allows transmission of an electrical signal between the leads and the integrated circuit, through the bond pad and the electrical interconnects on the preformed base insulating substrate.

Additionally, a retaining structure is constructed on the base insulating substrate, such that the retaining structure encircles the imager chip. Thus, the retaining structure and the planar surface of the base insulating substrate form a recess, in which the imager chip is mated to the base insulating substrate. The retaining structure may be made of an epoxy or resin, and may be formed on the base insulating substrate before or after the mating of the imager chip to the base insulating substrate.

A material is deposited in the recess. The material may be of a viscous nature so that it flows evenly in the recess. The material is allowed to cure or harden, forming a protective layer about the imager chip and isolating the imager chip from damage effect from an external environment.

The package the material may be an epoxy, and when the epoxy is cured, it forms a hardened protective coating to the imager chip. Or, the material added to the recess may be originally in a hardened form, such as a low melting point powder. Upon curing at a low temperature, high enough to melt the powder or solid material to a viscous stage, yet still low enough to not damage the imager chip, the material again forms a protective layer surrounding the imager chip.

The invention also provides a package where the base insulating substrate is prefabricated with multiple layers. Internal layers, as well as the surface layer may contain circuitization, allowing for the imager chip to be connected to the appropriate lead either through circuitization on the surface of the base insulating substrate, or through circuitization within the base insulating substrate, or some combination. The pins of the package may be in several configurations. The pins may be arranged on the periphery of the package (an LCC type arrangement), or they may be arranged in an array on the bottom of the base insulating substrate (a PGA or BGA type arrangement.)

The chip may allow different types of signals to be input or output. The chip may operate with analog electrical signals, digital electrical signals, or some combination. In the case where the array type arrangement is used, the analog signals or the high speed digital signals may be coupled to the leads nearest the imager chip (the innermost lead layer), in order to minimize electrical interference based on the signal or on the geometries of the interconnects.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION OF THE INVENTION

Figure 1:
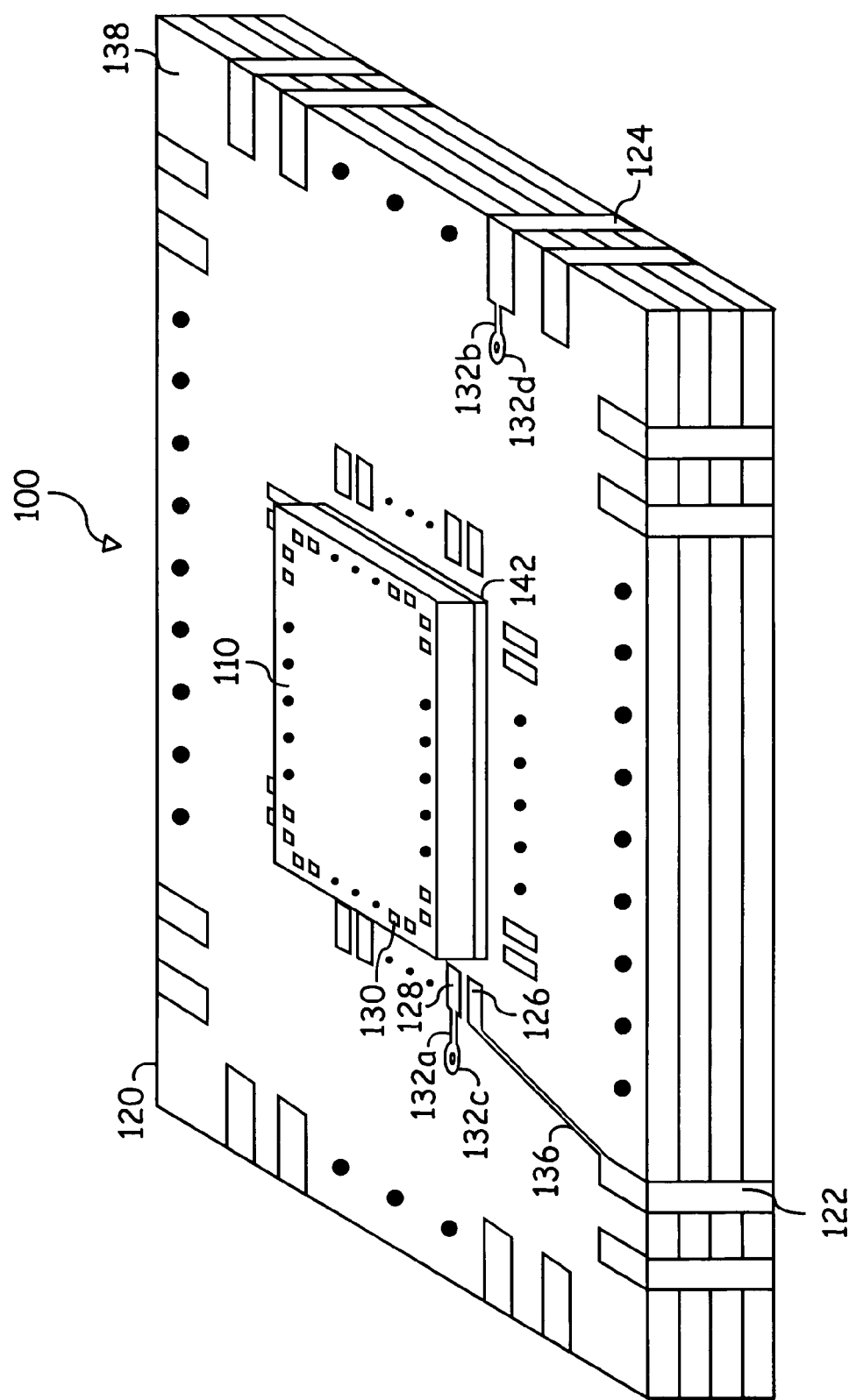
FIG. 1 is a perspective diagram of one embodiment of an integrated circuit package, where a printed circuit board is used in the packaging of an imager integrated circuit chip to form a leadless chip carrier type package.

FIG. 1 is a perspective diagram of one embodiment of an imager integrated circuit package, where a printed circuit board is used in the packaging of an imager integrated circuit chip to form a leadless chip carrier type package. Specifically, an imager IC (Integrated Circuit) package 100 comprises a PCB (Printed Circuit Board) 120 and an imager IC chip 110 mounted thereon. The PCB 120 is made of any material common to the construction of any conventional PCB, or any other type of easily and mass-produced electronic component substrate.

The PCB 120 has a plurality of package leads, e.g., package leads 122 and 124. The package leads, in turn, connect to one or more electrical interconnects (such as electrical interconnects 132 and 136) within or on a surface 138 of the PCB 120. The electrical interconnects of the PCB 120 are coupled to bond leads, e.g., bond leads 126 and 128, on the surface of the PCB 120.

The imager IC chip 110 has a plurality of bond pads, e.g., bond pad 130, that correspond to the bond leads of the PCB 120 for bond wire interconnection. For example, a bonding machine may connect the bond pad 130 to the bond lead 126 by placing and bonding a wire (not shown) therebetween. As a result, an electrical connection between the IC chip 110 and the external environment is created from the IC bond pad 130 to the package lead 122 by way of the bond wire, the bond lead 126, and the electrical interconnect 136. The electrical path runs along the surface 138 of the PCB 120.

Alternately, if the bond wire is placed between the bond pad 130 and the bond lead 128, the electrical path will run in an internal routing layer of the PCB 120. Specifically, if so placed, the electrical path could run, for example, between the package lead 124 and the bond pad 130 by way of the bond wire, the bond lead 128, interconnect portions 132*a–d*, and an interconnect portion (not visible) that runs within a layer of the PCB 120 between the interconnect portions 132*c* and 132*d*. The interconnect portions 132*c* and 132*d* are plated through holes (also known as "vias") that electrically connect an interconnect portion on one layer with that of another layer.

The PCB 120 is preconstructed to match the electrical contacts present on the IC chip 110. The PCB 120 is preconstructed using widely known techniques, such as described above. Additionally, through judicious use of area on the PCB 120, or alternatively using interconnections within the PCB 120, the outputs from any one of the electrical contacts from the IC chip 110 may be rerouted to any one or more package leads present on the imager IC package 100.

The PCB 120 may be constructed using pre-existing methods cheaply and efficiently. Various circuitries and interconnection patterns may be constructed on and within the PCB 120. The bond pads electrically connecting the IC chip 110 to the PCB 120 may be constructed in any manner employed in conventional packaging interconnect techniques.

After attaching the IC chip 110 to the PCB 120 through an adhesive 142, bond wires are placed by a bonding machine as previously discussed. Gold wires are typically used, and bonds are typically made by thermal compression bonding with a heated tool in a metal to metal diffusion process. Alternatively, the bonding of the bond pads of the IC chip 110 and the bond leads of the PCB 120 may be handled through a process called wire tape bonding. This consists of simultaneously attaching a flexible tape of wires from a plurality of bond pads to corresponding plurality of bond leads.

Of course, many other types of interconnections are possible. For example, flip chip interconnections may be made between the bond pads and the bond leads. The flip chip interconnection allows the connections on the chip to be arranged in an area as opposed to being peripherally arranged around the chip. The flip chip connections are made by very small solder balls formed by the sequence of process steps for the IC chip 110. Later, when the IC chip 110 is placed on the PCB 120, the solder balls connect and melt onto an array of metal pads on the PCB 120. The surface tension of the liquid solder helps align the IC chip 110 properly on the PCB 120. With this solder bonding, the IC chip 110 is electrically, mechanically, and thermally connected to the PCB 120. The solder has adequate ductility to endure the relative thermal displacements.

After bonding, the imager IC chip 110 is encapsulated and hermetically sealed. To support image capture, such encapsulation must provide an optical pathway for exposing the imager IC chip 110 to light. A variety of techniques may be used to accomplish this encapsulation and sealing as will be appreciated with reference to the subsequent figures.

Figure 2:
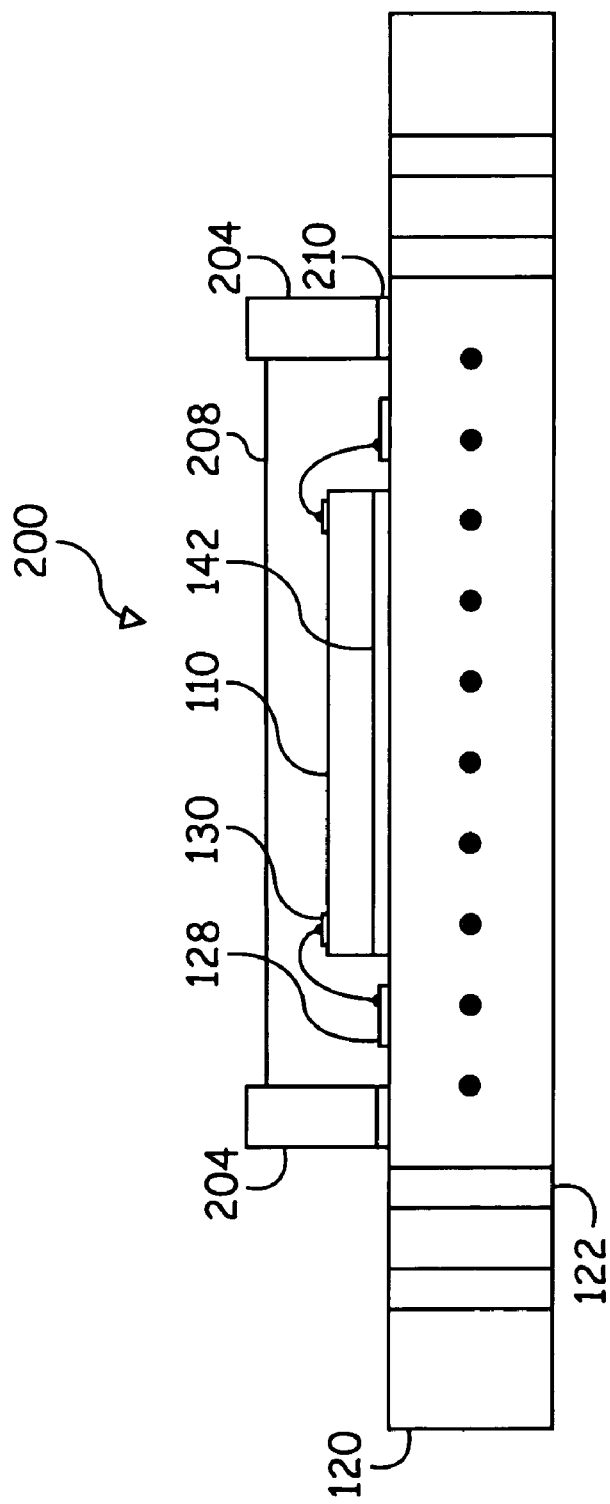
FIG. 2 is a cross-sectional diagram of the imager IC packaging of FIG. 1 with encapsulation using a filler containment wall.

FIG. 2 is a cross-sectional diagram of the imager IC packaging of FIG. 1 with encapsulation using a filler containment wall in accordance with the present invention. In particular, a wall of material, a containment wall 204 is constructed to surround the imager IC chip 110, associated bond wires, and the bond leads of the PCB 120. The containment wall is attached to the PCB 120 using an adhesive 210. Such constructions may occur before, after or during the process of attaching the IC chip 110 to the PCB 120. The containment wall 204 may be made of an inexpensive material, such as an epoxy or polymer or any other at least semi-rigid material. Once the containment wall 204 and the IC chip 110 are in place, a filler material 208 is added and left to cure and harden, completing the packaging of an imager IC package 200.

The filler material, also referred to as "optical material," may be any optical grade polymer, silicon gel, etc. The filler material is clear and serves to hermetically seal and protect the imager IC chip and associated bond wires. However, in some embodiments, the filler material has other optical characteristics, e.g., light filtering, for selecting or reflecting UV (ultraviolet), red, blue, etc. Such optical characteristics may be contained throughout the filler material, or in a layer thereof, for example, in a further coating layer below or above the primary filler material layer.

In this embodiment, the containment wall 204 corresponds to the rectangular shape of the imager IC chip 110, although any other shape might be used. The filler material 208 is injected into the cavity formed by the PCB 120 and the containment wall 204. The filler material 208 is electrically inert, allowing the uninterrupted operation of the IC chip 110 with the electrical connections on the PCB 120. The filler material 208 is typically transparent to allow an unimpeded pathway for light to reach the imager IC chip 110. However, in some embodiments, the filler material 208 also provides light filtering. For multiple imager designs, for example, the filler material might act as a red filter for one imager IC package. In another imager IC package, the filler material might act as a green filter, and blue in another package.

Figure 3:
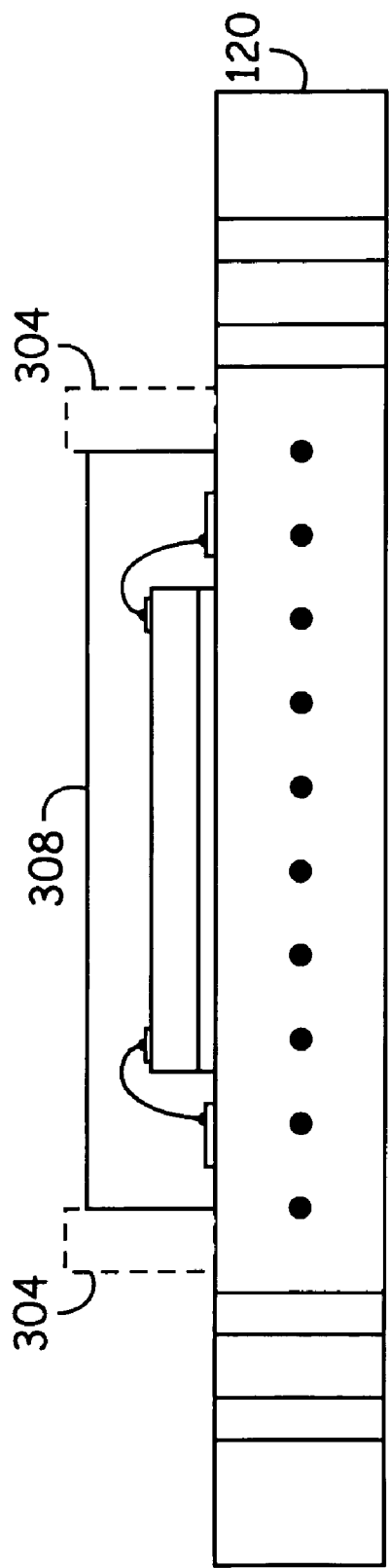
FIG. 3 is a cross-sectional diagram that illustrates an alternate embodiment of the final encapsulation of the chip of FIG. 1 where the containment wall is removed after the filler material cures.

FIG. 3 is a cross-sectional diagram that illustrates an alternate embodiment of the final encapsulation of the imager IC chip of FIG. 1, where the containment wall is removed after the filler material cures. Specifically, whether or not a containment wall 304 has been adhered to the PCB 120, after a filler material 308 at least begins to harden or has completed the hardening process, the containment wall 304 is removed. The containment wall 304 is held in place for the injection of the filler material and through a curing period in a single processing step.

Figure 4:
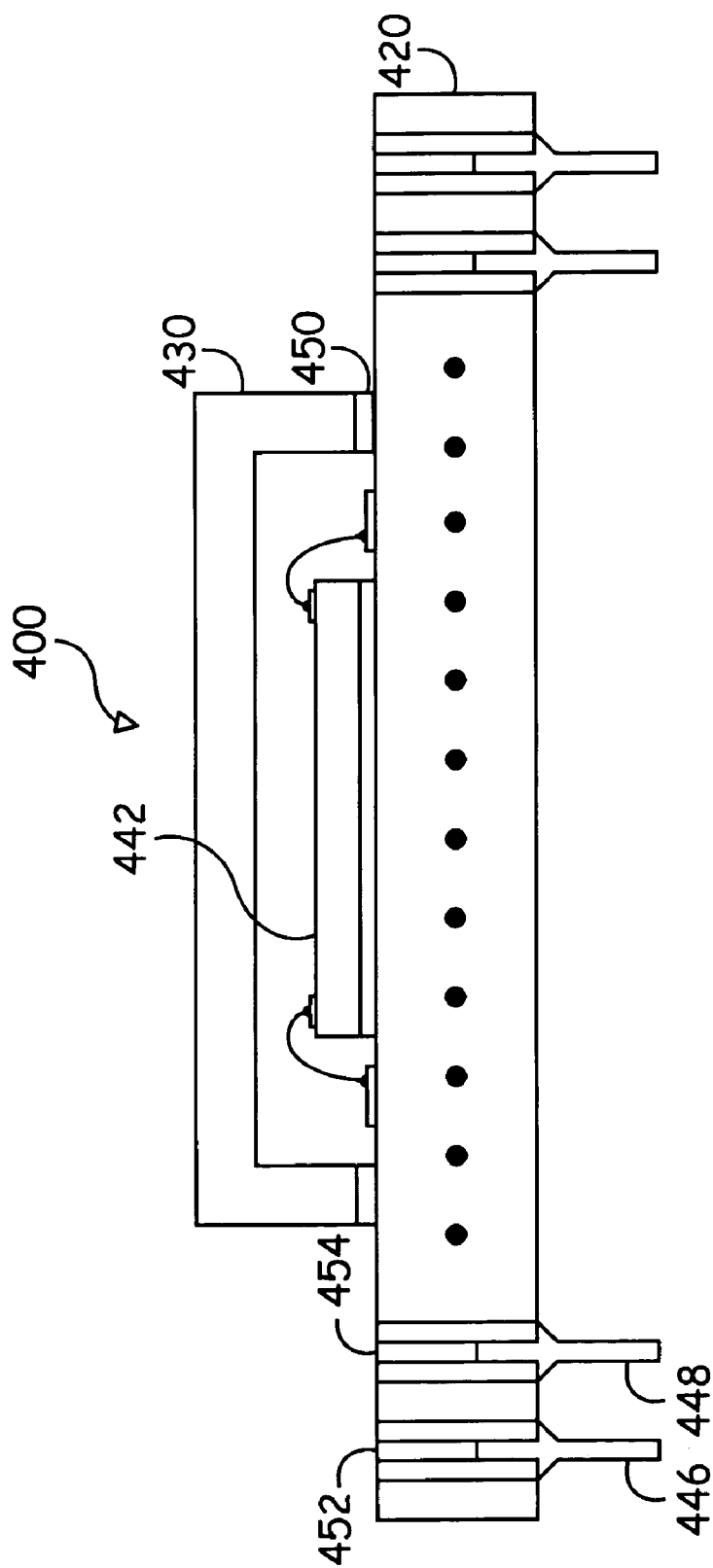
FIG. 4 is a cross-sectional diagram illustrating two of many possible variations that may be employed in chip package.

FIG. 4 is a cross-sectional diagram illustrating two of many possible variations that may be employed in an imager IC package. An imager IC package 400 comprises a PCB 420 and a cap 430 to encapsulate an imager IC chip 442. Instead of the leadless chip carrier type packaging of FIGS. 1–3, a leaded chip carrier having an array of package leads, such as package leads 446 and 448, which are attached to the PCB 420 is illustrated. The package leads 446 and 448, as other package leads, are inserted in plated through holes 452 and 454, respectively, and soldered into place. Alternatively, although not shown, the package leads may be soldered directly to target pads on the bottom surface of the PCB 420.

The cap 430 is pre-constructed and attached to the PCB 420 using an adhesive 450, eliminating the need for the filler material processing. The cap 430 is adhered to the PCB 420 after wire bonding the bond pads of an imager IC chip 442 to the bond leads of the PCB 420. As with the filler material, the cap 430 may be transparent or be constructed to act as a light filter.

In alternate embodiments, the cap 430 may comprise a wall and a lid which are finally adhered together before, during or after the wire bonding process. Similarly, at least the top portion (or lid) of the cap 430 may be comprise a plurality of layers, wherein each layer performs a different optical function such as filtering, polarization, apertures, lensing, etc. As may be appreciated, many such variations are possible.

Figure 5:
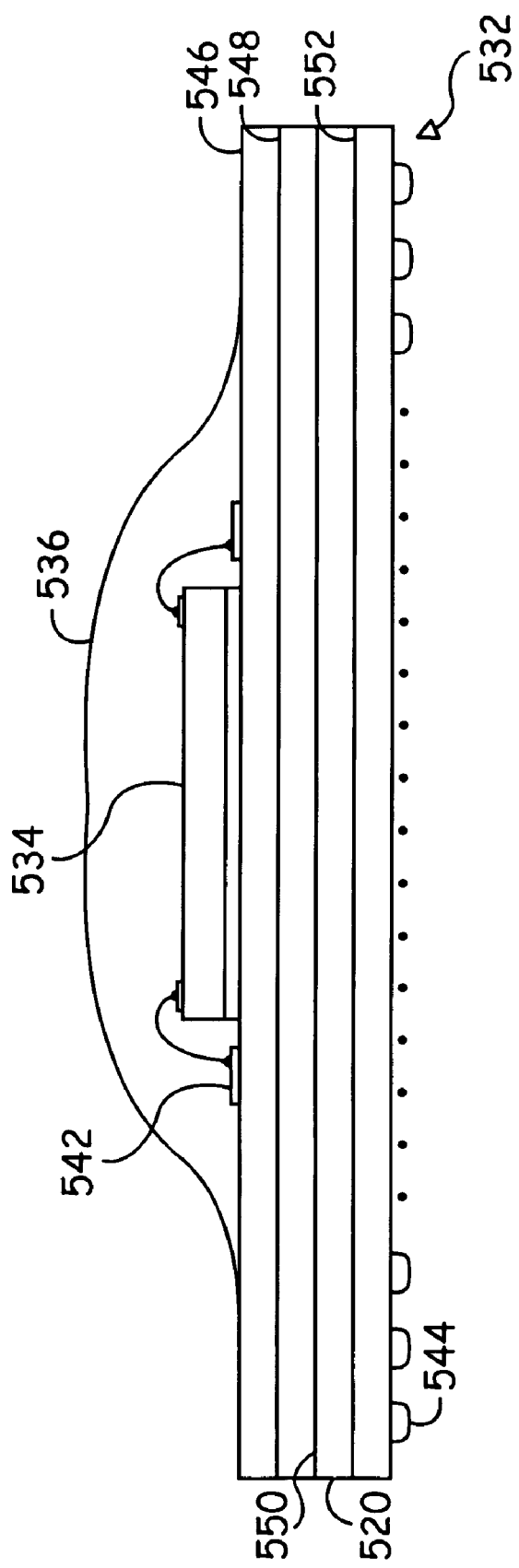
FIG. 5 is a cross-sectional view of another embodiment of an imager IC package, where the filler material is contained without retainer walls to form a ball grid array type PCB package.

FIG. 5 is a cross-sectional view of another embodiment of an imager IC package where no retainer walls are used to contain filler material to form a ball grid array type PCB package. A wall need not be employed because a viscous filler material is poured over the IC chip and allowed to cure. Specifically, a four layer PCB 520 is sized as a ball grid array type IC package, as illustrated. A ball grid array of interconnections 532 is placed on a lower surface of the PCB 520. On the top surface, an imager IC chip 534 is adhered and wire bonded to the PCB 520. Thereafter, a filler material 536 is poured over the imager then allowed to harden. As before, the filler material 536 may be transparent or otherwise to perform an optical function. The filler material 536 may also be deposited in layers, with each layer possibly performing a different optical function.

As with all of the multi-layer PCB's, the PCB 520 provides internal and surface routing electrical interconnects between bond leads and package leads. A bond lead 542 may be connected to a solder ball 544 of the ball grid array 532 by way of interconnect routing on a surface 546 to the solder ball 544 by way of interconnect and plated through hole routing on interconnect layers 548, 550 and 552. One or more of the interconnect layers of the PCB 520 may be designed as a ground-plane to isolate the imager IC chip and electrical pathways connected thereto from noise sources. With or without ground-plane usage, careful routing on and within the PCB 520 can minimize noise between otherwise adjacent high-speed digital and analog signal lines.

Figure 6:
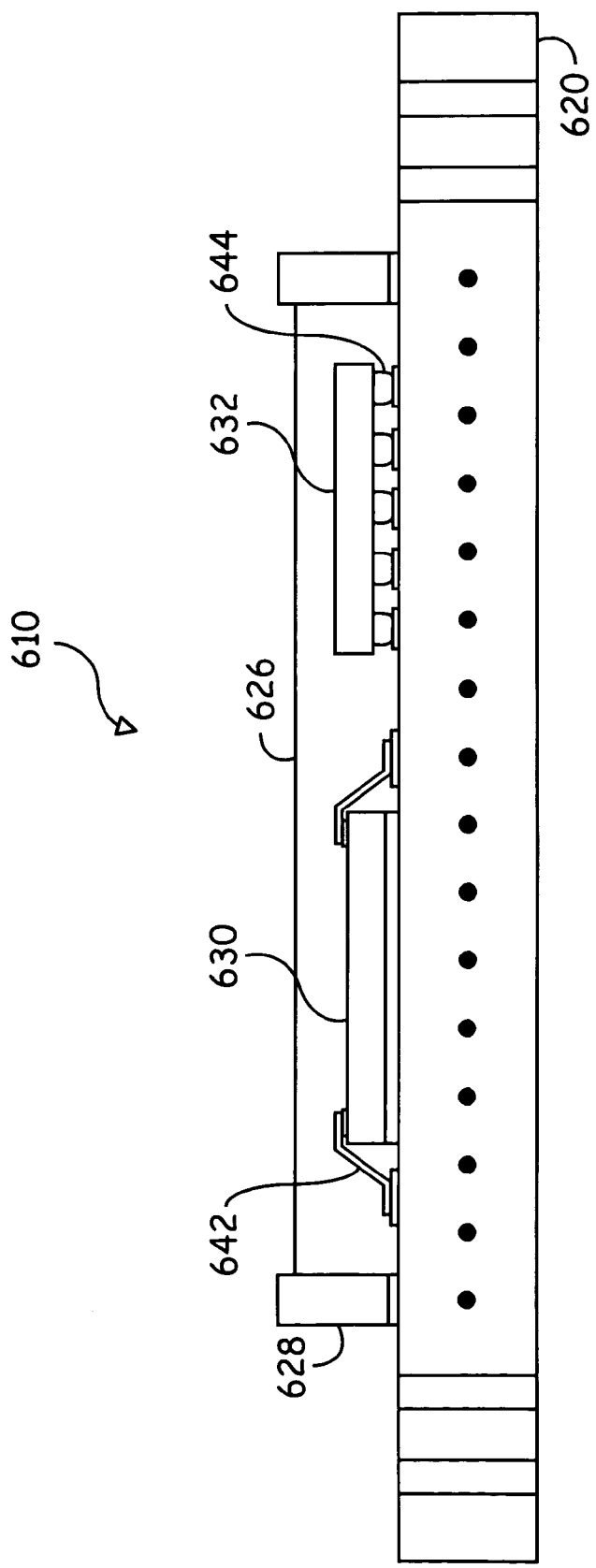
FIG. 6 is cross-sectional diagram illustrating that multiple chips may be simultaneously encapsulated.

FIG. 6 is a cross-sectional diagram illustrating that multiple IC chips may be simultaneously encapsulated in an alternate embodiment. An imager multi-chip IC package 610 is constructed from a PCB 620 and filler material 626 that encapsulate an imager IC chip 630 and an associated imager logic chip 632. To illustrate further packaging variations, the imager IC chip 630 is electrically coupled to the PCB 620 using bonding tape 642, while the imager logic chip 632 is coupled to the PCB 620 through a flip-chip configuration via an array of solder balls, such as a solder ball 644. A containment wall 628 forms the cavity in which the filler material 626 is injected and cured. Of course, many other variations are possible, e.g., further IC chips and other active and passive components may be encapsulated within the filler material 626. As before, the filler material 626 may be transparent or act as a filter to meet specific design needs.

Figure 7:
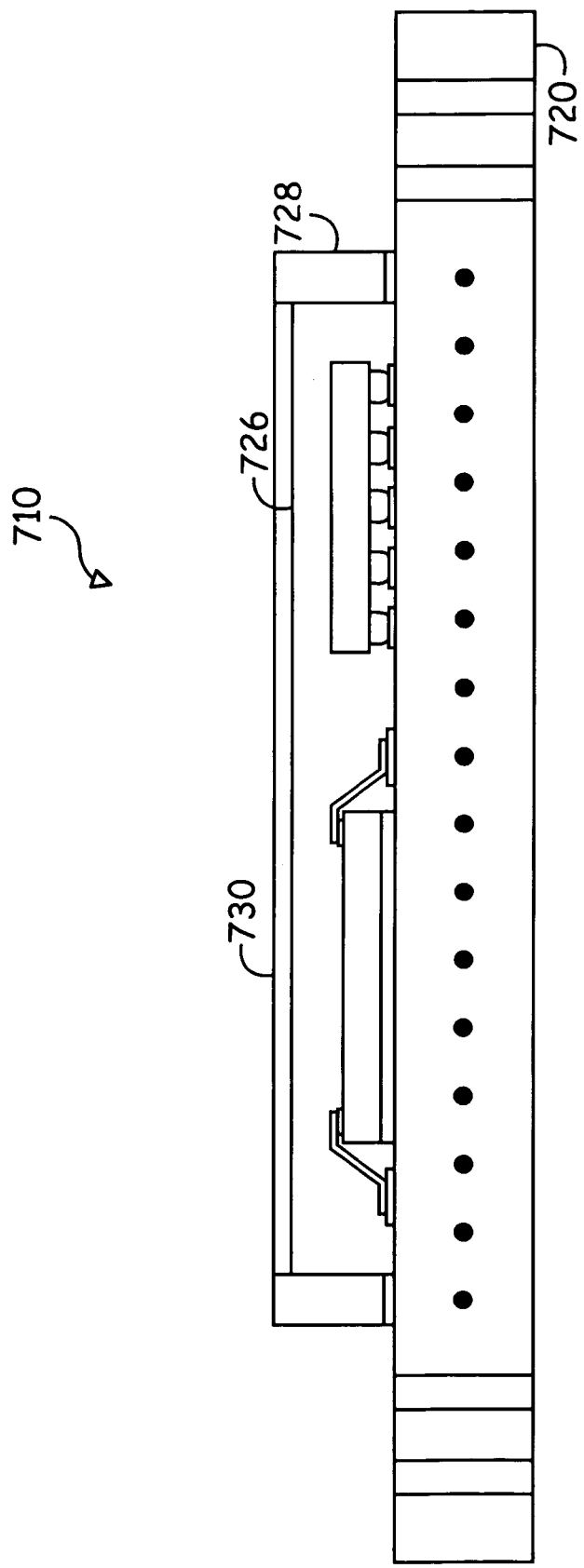
FIG. 7 is cross-sectional diagram of an alternate embodiment of the multi-chip imager package of FIG. 6 where the filler material comprises a plurality of layers.

FIG. 7 is cross-sectional diagram of an alternate embodiment of the multi-chip imager package of FIG. 6, wherein the filler material comprises a plurality of layers. First, a filler material 726 is disposed to partially fill the cavity formed by a containment wall 728 and a PCB 720. After an appropriate curing time, another filler material 726 is added and cured. Additional layers could be added. Such layering of filler materials can be used merely to assist in the filling process, or might be used for specific optical purposes. For example, the filler material 728 might have filter characteristics, while the filler material 726 acts transparently.

Figure 8:
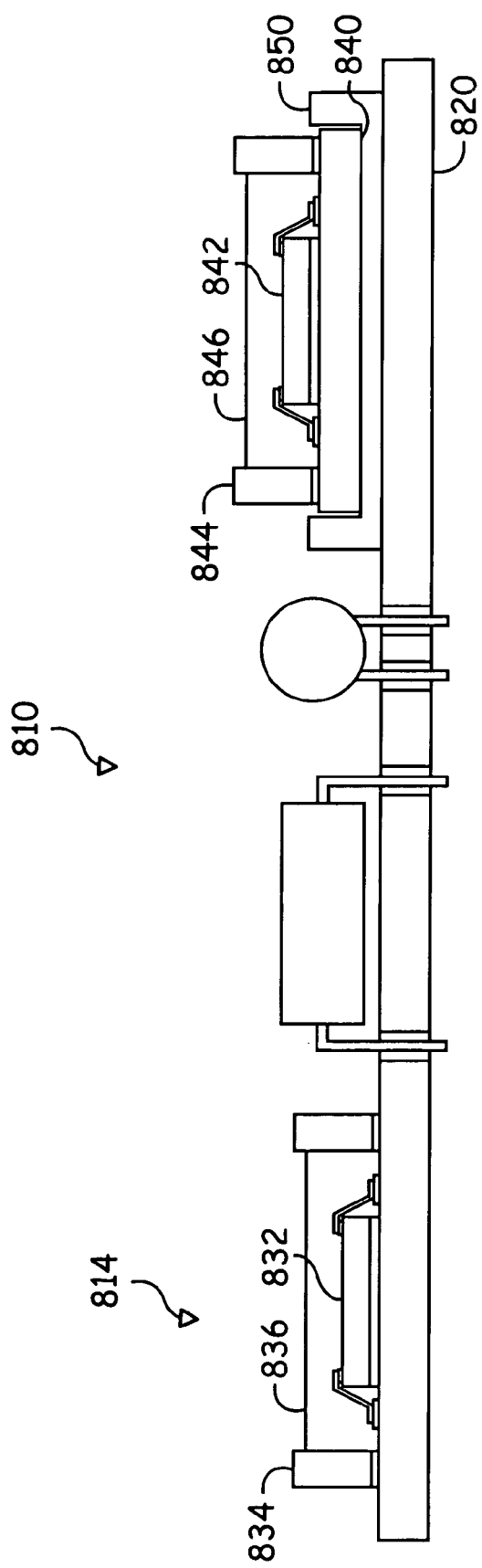
FIG. 8 is a cross-sectional diagram of a printed circuit board that operates as a package for one imager while accepting a printed circuit board chip package such as those illustrated in the previous FIGS. 1–7.

FIG. 8 is a cross-sectional diagram of a printed circuit board that operates as a package for one imager while accepting a printed circuit board imager IC package such as those illustrated in the previous FIGS. 1–7. Specifically, a PCB 820 forms part of an imager IC package 814 as described previously in reference to the previous Figures. Even so, the PCB 820 need not constitute a package itself which is mounted within a socket of another PCB. Instead, the PCB 820 may comprise, for example, a motherboard or an edge-engaging card.

The package for an imager IC chip 832 comprises the PCB 820, a containing wall 834, and filler material 836. Similarly, another package for an imager IC chip 840 comprises a PCB 840, a containing wall 844, and filler material 846. Unlike the PCB 820, the PCB 840 is constructed as shown in previous Figures to engage a socket 850 that is directly mounted on the PCB 820. Other IC packages (such as a package 860) and discrete components (such as a component 862) may also be mounted on the PCB 820 in any traditional manner.

Figure 9:
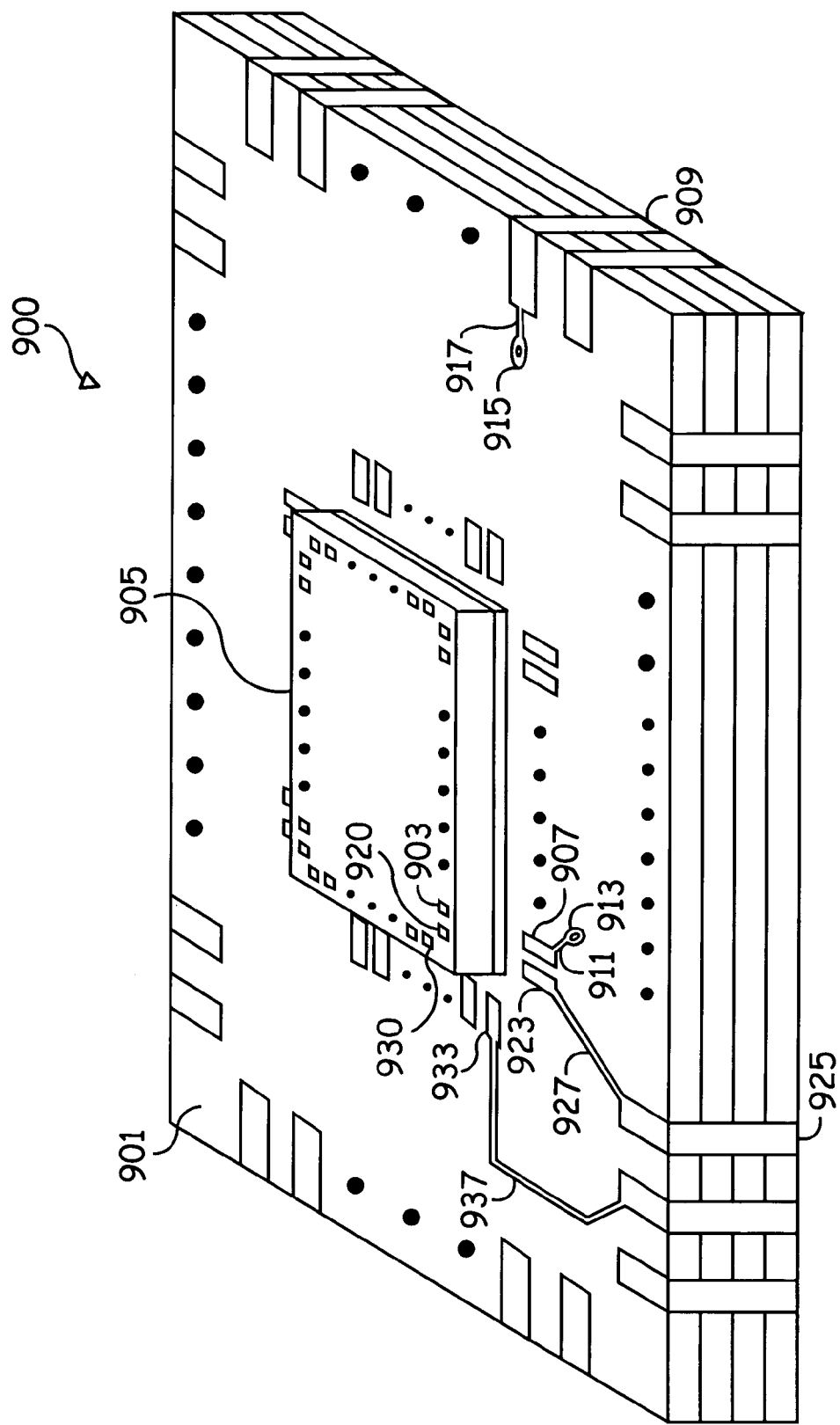
FIG. 9 is a perspective view of a chip package without the filler material or retaining walls (if used), illustrating routing techniques that may be employed to minimize noise.

FIG. 9 is a perspective view of an imager IC package prior to depositing the filler material and retaining walls (if used), illustrating routing techniques that may be employed to minimize noise and cross-talk. Specifically, in an imager IC package 900, a four layer PCB 901 provides five possible routing layers for interconnecting bond leads to off-package circuitry through the package leads. For example, a bond pad 903 of an imager IC chip 905 is connected to a bond lead 907 through a bond wire or bonding tape (not shown). The bond lead 907 is connected to a package lead 909 by way of routing interconnects. As illustrated, such interconnects include traces 911 and 917, plated-through holes 913 and 915, and other traces and possibly other plated-through holes (not shown) within or on the PCB 901.

Similarly, a bond pad 920 may be coupled to a package lead 925 by way of a bond wire, a bond lead 923 and a trace 927. Likewise, a bond pad 930 is coupled to a package lead 935 via a bond lead 933 and a trace 937. Thus, as may be appreciated, the trace 927 may carry high-speed digital or analog signals which might normally interfere with adjacent signals. To minimize such interference, the trace 937 has been routed away from the trace 927 which has been given a most direct path to off-board circuitry. Also to minimize such interference, the interconnection of the bond lead 907 and the package lead 909 takes place at layers beneath the surface layer of the PCB 901.

In some embodiments, such interconnection may take place below a ground-plane PCB layer to further minimize such interference. Alternatively, the high-speed digital or analog signal on flowing between the bond lead 923 and the package lead 925 might itself be routed in a lower layer of the PCB 901 and, possibly, between two ground-plane layers. Many other techniques applied to traditional PCB routing may also be employed to minimize noise.

If any second level package that ultimately uses the imager IC package 900 needs a reconfiguration of leads for design purposes, this may be easily accomplished in the PCB 901, rather than in a redesign of the electrical contacts of the imager IC chip 905. Without changing the external electrical wiring or contacts of the imager IC chip 905, the outputs of the imager IC package 900 can be easily altered or rerouted by simply rerouting the traces, such as the trace 937. This allows for easy and cost effective way to change input and output pins locations without the need to reconfigure the imager IC chip 905.

The imager IC chips illustrated in FIGS. 1–9 may comprise CMOS (Complementary Metal Oxide Semiconductor) imagers, CCD (Charge Coupled Device) imagers, or any other type of semiconductor-based image capture technology. Although only a few of package types are illustrated in FIGS. 1–9, many other package types might be employed using a PCB in the construction process in accordance with the present invention.

While various embodiments of the invention have been described, it will be apparent to those of ordinary skill in the art that many more embodiments and implementations are possible that are within the scope of this invention.

We claim:

1. A package for an imager integrated circuit chip, the imager integrated circuit chip having a bond pad for communicating an electrical signal to or from the imager integrated circuit chip, the package comprising:
   a printed circuit board comprising:
      multiple routing layers including a plurality of bond leads and a plurality of package leads, wherein at least one package lead is electrically coupled to at least one bond lead; and
      at least one of the multiple routing layers comprises a ground plane;
   the imager integrated circuit chip disposed on the printed circuit board and coupled to at least one of the plurality of bond leads to thereby allow communication of the electrical signal between the at least one package lead and the imager integrated circuit chip; and
   an optical cover, disposed on the printed circuit board, that, with the printed circuit board, encapsulates the imager integrated circuit chip.

2. The package of claim 1, wherein the printed circuit board further comprising:
   a retaining structure disposed on the printed circuit board around the imager integrated circuit chip, the retaining structure and the printed circuit board forming a recess in which the imager integrated circuit chip is mated to the printed circuit board; and
   the optical cover comprising a filler material deposited in the recess.

3. The package of claim 2 wherein the filler material comprises a protective coating over the imager integrated circuit chip.

4. The package of claim 1 wherein the at least one package lead is arranged on a periphery of the printed circuit board.

5. The package of claim 1, wherein the at least one package lead comprises a plurality of package leads arranged in an array.

6. The package of claim 1 wherein the electrical signal is routed to reduce capacitive or inductive interference.

7. A chip carrier package for an imager integrated circuit chip, the imager integrated circuit chip having a plurality of electrical pads, the package comprising:
   a preformed package base comprising:
      an insulating substrate comprising multiple routing layers including a plurality of bond leads and a plurality of package leads electrically coupled to the plurality of bond leads, wherein at least one package lead is electrically coupled to the at least one bond lead; and
      at least one of the multiple routing layers comprises a ground plane;
      a plurality of bond leads disposed on the insulating substrate; and
      a plurality of package leads electrically coupled to the plurality of bond leads; and
   the imager integrated circuit chip disposed on the preformed package base; and
   an optical material disposed on the imager integrated circuit chip as a a hardened protective coating over the imager integrated circuit chip.

8. The chip carrier package of claim 7, further comprising:
   a retaining structure surrounding the imager integrated circuit chip, the retaining structure and the preformed package base forming a recess in which the imager integrated circuit chip is disposed on the preformed package base; and
   the optical material being deposited in the recess before it has cured.

9. The chip carrier package of claim 7 wherein the optical material has light transmission characteristics.

10. The chip carrier package of claim 7 wherein at least one of the plurality of package leads is arranged on a periphery of the preformed package base.

11. The chip carrier package of claim 7, wherein the preformed package base supports the plurality of package leads in an array.

12. An imager component comprising:
   a printed circuit board comprising a plurality of bond leads and a plurality of package leads a printed circuit board comprising
      a) multiple routing layers, a plurality of bond leads and a plurality of package leads;
      b) at least one of the multiple routing layers comprising a ground-plane;
      c) at least one of the plurality of bond leads coupled to at least one of the plurality of package leads;
   an imager integrated circuit chip coupled to the printed circuit board and to the at least one of the plurality of bond leads; and
   an optical material deposited on the imager integrated circuit chip and cured to protect the imager integrated circuit chip from an external environment.

13. The imager component of claim 12 further comprising a containment structure engaging the printed circuit board, the containment structure and the printed circuit board forming a recess in which the imager integrated circuit chip is disposed on the base insulating substrate.

14. The imager component of claim 13 wherein the optical material has a light transmission characteristic.

* * * * *